US009100060B2

(12) United States Patent
Ilkov (10) Patent No.: US 9,100,060 B2
(45) Date of Patent: Aug. 4, 2015

(54) SYSTEM AND METHOD FOR A RADIO FREQUENCY SWITCH

(75) Inventor: Nikolay Ilkov, Munich (DE)

(73) Assignee: Infineon Technologies AG, Neubiberg (DE)

(*) Notice: Subject to any disclaimer, the term of this patent is extended or adjusted under 35 U.S.C. 154(b) by 575 days.

(21) Appl. No.: 13/325,860

(22) Filed: Dec. 14, 2011

(65) Prior Publication Data

US 2013/0154761 A1 Jun. 20, 2013

(51) Int. Cl.
| H01P 1/10 | (2006.01) |
| H04B 1/00 | (2006.01) |
| H03H 7/46 | (2006.01) |
| H04B 1/44 | (2006.01) |
| H03K 17/693 | (2006.01) |

(52) U.S. Cl.
CPC ............ *H04B 1/0057* (2013.01); *H03H 7/465* (2013.01); *H04B 1/006* (2013.01); *H03K 17/693* (2013.01)

(58) Field of Classification Search
CPC ............... H01P 1/10; H01P 1/15; H04B 1/44
USPC ................................ 333/101, 103; 455/78, 83
See application file for complete search history.

(56) References Cited

U.S. PATENT DOCUMENTS

| 6,381,446 | B1 | 4/2002 | Meixner |
| 7,027,779 | B2 * | 4/2006 | Tai et al. .................... 455/83 |
| 7,049,906 | B2 | 5/2006 | Wilcox |
| 7,171,234 | B2 * | 1/2007 | Kemmochi et al. ........ 455/552.1 |
| 7,295,814 | B2 * | 11/2007 | Yamashita et al. .............. 455/83 |
| 7,313,367 | B2 | 12/2007 | Bialek et al. |
| 2004/0239442 | A1 | 12/2004 | Wilcox |
| 2011/0105055 | A1 | 5/2011 | Ilkov |
| 2013/0021113 | A1 | 1/2013 | Bakalski et al. |

FOREIGN PATENT DOCUMENTS

| CN | 1795617 A | 6/2006 |
| DE | 835893 A1 | 2/2000 |
| JP | 2007504776 A | 3/2007 |
| KR | 20070110554 A | 11/2007 |
| WO | 2011104313 A1 | 9/2011 |

OTHER PUBLICATIONS

Anatol I. Zverev, Handbook of Filter Synthesis, 2007, John Wiley & Sons, 23 pages.*
Infineon Technologies, AG, "BGSF18DM20 SP8T Antenna Switch Mode with Integrated SPI controller, 2 GSM-Tx and 6 WCDMA-TRx Ports for 2G/3G Convergence" Data Sheet, RF & Protection Devices, Mar. 7, 2011, pp. 17.

* cited by examiner

*Primary Examiner* — Dean Takaoka
(74) *Attorney, Agent, or Firm* — Slater & Matsil, L.L.P.

(57) ABSTRACT

In accordance with an embodiment, a filter network is configured to be coupled to a first switch, a second switch, and an output port. The filter network includes a first filter coupled between the first switch and the output port, and the second filter coupled between the second switch and the output port. The first filter has a pass band having a first frequency range that includes a first frequency, and a stop band that includes a second frequency that is a distortion product of the first frequency. The second filter has a second frequency range that includes the second frequency and the stop band that includes the first frequency. The second frequency range is higher in frequency than the first frequency range.

24 Claims, 5 Drawing Sheets

SYSTEM AND METHOD FOR A RADIO FREQUENCY SWITCH

TECHNICAL FIELD

This invention relates generally to radio frequency circuits and methods, and more particularly to a system and method for testing a radio frequency switch.

BACKGROUND

The increasing number of frequency bands and standards in mobile communication systems increases the design complexity of mobile phones, as some mobile phones are now configured to operate using multiple standards across multiple frequency bands. In addition, the mobile phone may also include a Global Positioning System (GPS) receiver. In many mobile phones, these multiple frequency bands and standards are implemented by using multiple radio frequency (RF) transmitters and receivers within multiple signal paths that may be coupled to a single antenna using an antenna switch. The introduction of more and more frequency bands within the mobile phone, however, may cause some issues with respect to jamming due to the creation of distortion products within circuitry of the mobile phone and within the antenna switch itself.

In mobile phone systems that have multiple antennas, distortion products created in the transmitter may leak into the receive path via one of the multiple antennas or via parasitic paths within the mobile phone itself. An example of this is the case of the mobile phone that has an antenna used to communicate with a base station according to one of the various mobile telecommunication standards, and GPS receiver. If, for example, one of the mobile phone transceivers is a Universal Mobile Telecommunications System (UMTS) transceiver operating on band 13 with uplink frequencies in the range of 777 MHz to 787 MHz, second order distortion products may be generated within the GPS frequency band at about 1572 MHz. Some conventional mobile phone systems may address this issue by using a costly and bulky Hi-Q sharp band stop filter in series with the antenna port, because the GPS band is only about 150 MHz away from several cellular telephone bands.

SUMMARY OF THE INVENTION

In accordance with an embodiment, a filter network is configured to be coupled to a first switch, a second switch, and an output port. The filter network includes a first filter coupled between the first switch and the output port, and the second filter coupled between the second switch and the output port. The first filter has a pass band having a first frequency range that includes a first frequency, and a stop band that includes a second frequency that is a distortion product of the first frequency. The second filter has a second frequency range that includes the second frequency and the stop band that includes the first frequency. The second frequency range is higher in frequency than the first frequency range.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context: an antenna switch for a mobile phone system that operates in multiple bands. The invention may also be applied to other multiband systems that multiplex multiple signal paths to a common port.

Modern communication systems typically operate in many different frequency bands but use one main communication band depending on the type of service and geographic location. For example, a cellular phone may be configured to operate on a Code Division Multiple Access (CDMA) network in one region, and on a Global System for Mobile Communications (GSM) network in another region or while roaming. In such devices, dedicated filtering is performed for each different band and the filters are connected to the antenna one at time by an antenna switch. Architecturally, several narrow band radio frequency ports may be connected to one antenna using single pole n-throw (SPnT) switches, or to two antennas, using dual pole n-throw switches (DPnT), where n represents the number of RF ports to be connected to the antenna. SPnT switches are often composed of n switching elements joined together in single port. DPnT switches are more complex, but in their simplest variant, each RF port is connected or isolated from just one antenna and may be considered as an combination of two SPmT and SP(n-m)T switches. An embodiment DPnT switch may have a matrix (each input to each output) or star configuration (SPxT and SPyT driven from same logic). In some embodiments, the switches may be separated by a frequency band.

Figure 1:
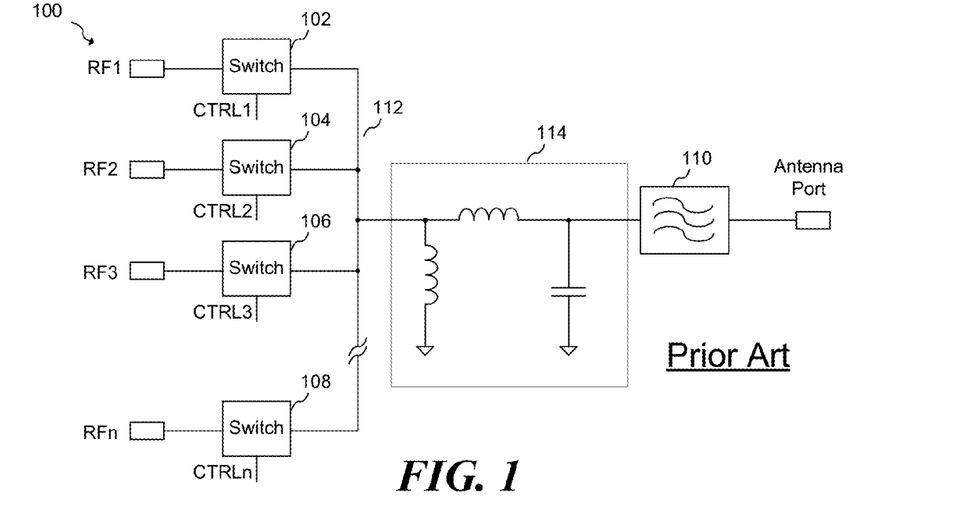
FIG. 1 illustrates a conventional antenna switch.

FIG. 1 illustrates an example of conventional SPnT RF switch 100, which may be used to couple one of a plurality of RF ports to an antenna port. SPnT RF switch 100 has switches 102, 104, 106, and 108 coupled to a common port 112. Because switching elements 102, 104, 106, and 108, generally are not ideal and present some parasitic capacitance even when set to an isolated state, matching network 114 may be used in a standard impedance system (e.g. 50 ohm) as shown.

Furthermore, switching elements 102, 104, 106, and 108 forming SPnT RF switch 100 may generate harmonics and intermodulation products of the applied RF signals due to nonlinearities within the switches. Such generated harmonics and intermodulation signals may disturb receivers operating at the same time it the same system or in other systems in close proximity. One conventional way of dealing with generating with out of band distortion is by using high-Q filter 110 coupled between switches 102, 104, 106, and 108 and the antenna port. Some conventional antenna switches may even use a switched band stop filter that is activated only for frequencies producing the unwanted harmonics. Other conventional embodiments may add an additional switching element (not shown) or series transistor between outputs of the switches. For example, an additional switch may be placed in series between the output of switch 106 and the output of switch 104 in order to decouple parasitic switch capacitance or to reduce the amount of harmonics generated by the switches.

Figure 2A:
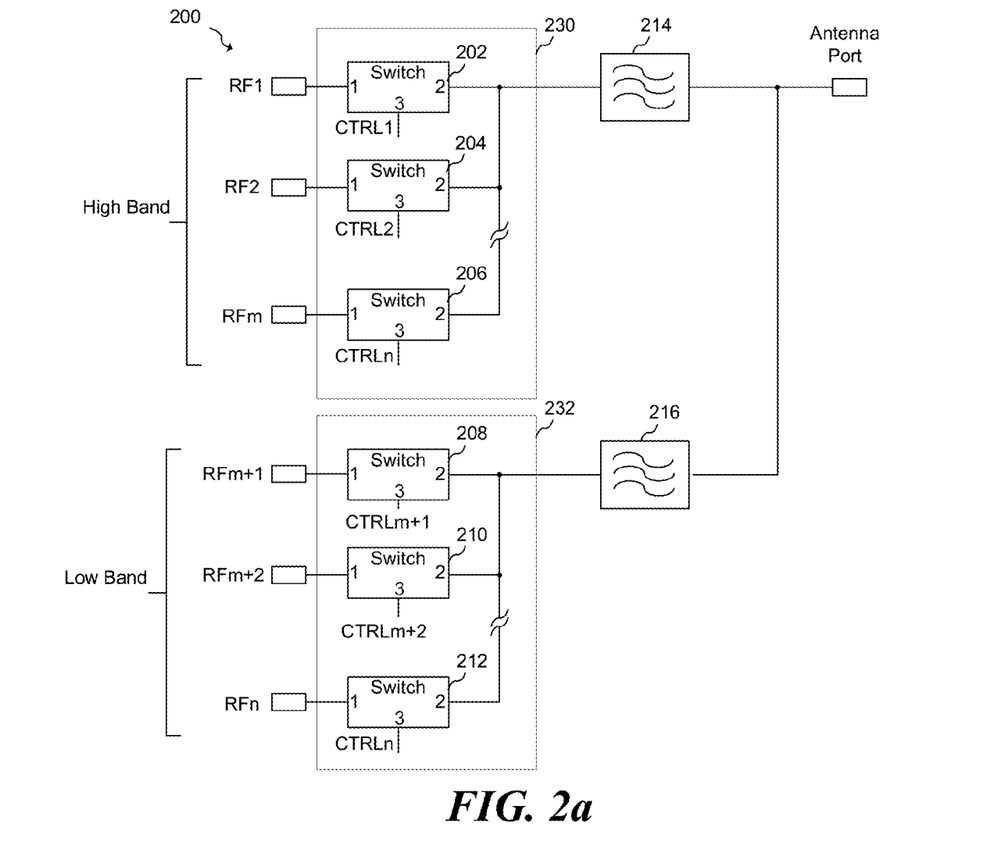
FIGS. 2a-b illustrate schematics of an embodiment antenna switch.

FIG. 2a illustrates antenna switch 200, according to an embodiment of the present invention. Here, two SPnT switches are used: SPnT switch 230 serving frequency bands lying close to disturbing harmonics, and SPnT switch 232 serving frequency bands close to the signal producing the unwanted harmonics. In one embodiment, SPnT switch 230 serves frequency bands having frequencies greater than 1.5 GHz. These bands may support mobile telecommunications technologies including, but not limited to PCS, DCS, and UMTS B1 and B2. SPnT switch 232, on the other hand, serves frequency bands having frequencies less than about 1 GHz. These lower frequency bands may support mobile telecommunications technologies including, but not limited to GSM850, GSM900, and UMTS B5. Ports 1 to m are connected to high-band SPnT switch 230, and the remaining ports are coupled to low-band SPnT switch 232. It should be appreciated that the frequency ranges for SPnT switch 230 and SPnT switch 232 are just embodiment examples of a particular system. In alternative embodiments, other frequency ranges may be used.

Filter 214 is coupled between high band SPnT switch 230 and the antenna port, and filter 216 is coupled between low band SPnT switch 232 and the antenna port. Filter 216 is configured to reject a second harmonic of a first frequency served by low band SPnT switch 232. Filter 214, on the other hand, is configured to reject the first frequency served by low band SPnT switch 232. For example, in one embodiment directed toward supporting UMTS band 13 and preventing harmonic generation in the GPS frequency band, filter 214 is configured to reject 786 MHz and filter 216 is configured to reject frequencies at about 1573 MHz. If a 786 MHz signal is being passed by SPnT switch 232, the second harmonic of the signal is attenuated by filter 216. However, filter 216 allows the 786 MHz signal to pass through to the antenna port. Furthermore, filter 214 attenuates this 786 MHz signal and prevents a 786 MHz signal of an appreciable amplitude at the output of switches 202 204 and 206. By attenuating the signal at this point, second harmonic generation at the output of switches 202, 204 and 206 is prevented.

In some embodiments, the second harmonic of 786 MHz is attenuated in two ways. First, the second harmonics that are generated by switches 208, 210 and 212 within SPnT switch 232 are directly attenuated by filter 216. Second, the second harmonic of 786 MHz is prevented from being generated at the output of SPnT switch 230 by attenuating the fundamental using filter 214. It should be appreciated that the specific example of a 786 MHz fundamental frequency and a 1573 MHz second harmonic is just one example of many possible embodiments. In alternative embodiments, a different fundamental may be used or a different harmonic may be chosen for filtering. For example, the generation a third harmonic of fourth harmonic or even an intermodulation product such as an IM2 product or an IM3 product may be reduced using embodiment techniques.

In embodiments, filters 214 and 216 may be implemented using systems having various topologies and having various frequency responses. For example, filter 214 may be implemented as a high pass filter and filter 216 may be implemented as a low pass filter. In some embodiments, filters 214 and 216 may be implemented as notch filters or even band pass filters. These filters may be implemented using SAW or BAW filters, lumped element filters, LC filters integrated on a GaAs or Silicon integrated Circuit, and/or integrated passive devices (IPD), integrated on a ceramic or organic substrate.

In an embodiment, the harmonic performance of the low-band filter is achieved by direct filtering self-generated unwanted harmonics by filter 216. In embodiments where these harmonics are located far enough away from the signal of interest, a simple band-stop filter, for example a second order band-stop filter, may be used. The harmonic performance of high-band switch 230, set in isolation, when the signal generating disturbing harmonics is transmitted, is achieved by reducing the power of the lower fundamental frequency seen by high-band switch 230. In embodiments where the lower fundamental frequency is located far enough away from the high-band frequencies served by SPnT switch 230, a simple band-stop filter may also be used for filter 214.

Because the power of the generated second harmonic increases for most types of semiconductor switches two times faster than the power of the fundamental signal, filtering the fundamental may result in a doubled harmonic rejection. In some embodiments in which filters 214 and 216 are both joined together at the antenna port, the stop bands of the filters are configured to have a high impedance to reduce the influence on the switched signal.

Figure 2B:
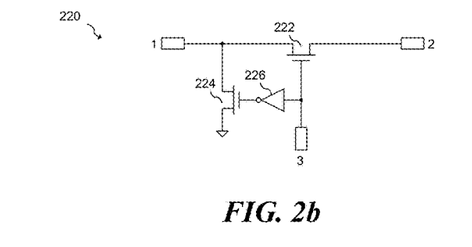

FIG. 2b illustrates embodiment switching element 220. Switching element 220 has transistor 222 coupled between ports 1 and 2, and transistor 224 coupled between port 1 and ground. Port 3, which serves as a select signal, is coupled to the gate of transistor 222. The gate of transistor 224 is connected to select signal three via inverter 226. In an embodiment, transistors 222 and 224 may be implemented in CMOS technology; however, other transistor types and switch technologies may be used. Inverter 226 is representative of a logic circuit that is used to control the gates of transistors 222 and 224. In alternative embodiments of the present invention, other logic structures may be used. During operation, when the signal at port 3 is set high, a conductive path is formed between port 1 and port 2, in the case of when the switching element is selected. When the input at port three is low, however, transistor 224 is turned on and transistor 222 is shut off, and port 1 is coupled to ground via transistor 224. In some embodiments port 1 is coupled to one of the plurality of RF input ports to the antenna switch.

Figure 3:
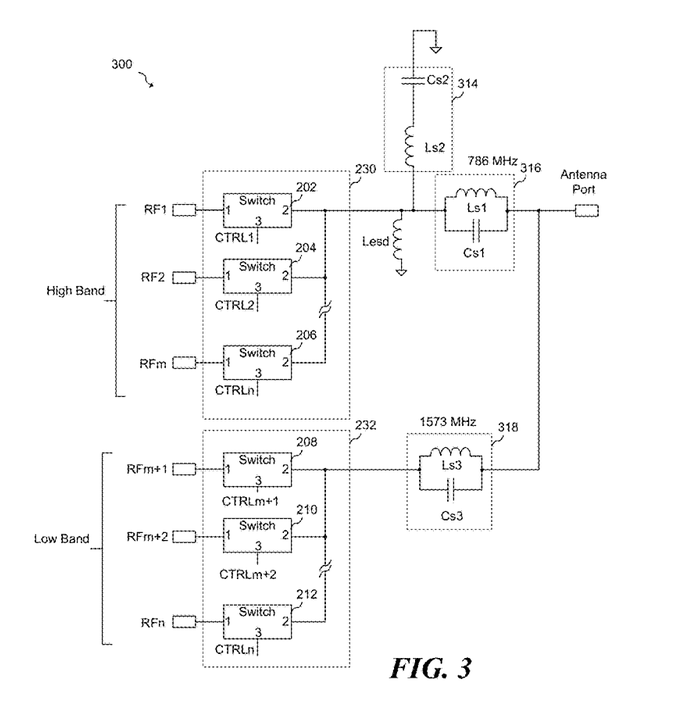
FIG. 3 illustrates an antenna switch according to a further embodiment.

FIG. 3 illustrates antenna switch 300 according to further embodiment of the present invention. Here, lumped element LC filter 318 is coupled between SPnT switch 232 in the antenna port, and lumped element LC filter 316 is coupled between SPnT switch 230 and the antenna port. In some embodiments, a further lumped element LC filter 314 is coupled between the output of SPnT switch 230 and ground. A further inductor Lesd may be coupled between the output of switch 230 and ground. Lesd may be used to provide electrostatic discharge (ESD) protection at low frequencies. In one embodiment, lumped element LC filter 316 is a notch filter having inductor Ls1 in parallel with capacitor Cs1 that is set to reject the fundamental frequency (786 MHz), and lumped element LC filter 318 is a notch filter having inductor Ls3 in parallel with capacitor Cs3 that is set to reject the second harmonic of the fundamental frequency (1573 MHz). Filter 314 is a series resonant LC circuit with a center frequency of about the second harmonic of the fundamental (~1573 MHz) that shunts energy in this frequency range to ground, thereby further rejecting any second harmonic energy that is generated at the output SPnT switch 230. Lesd is an ESD inductor that provides ESD protection at low frequencies. In one embodiment, component values are selected such that Ls1=1.9 nH, Cs1=18 pF, Ls2=12 nH, Cs2=0.75 pF, Ls3=1.9 nH, and Cs3=4.3 pF. It should be appreciated that these component values are specific examples of one embodiment. In alternative embodiments of the present invention, other component values and/or frequency ranges may be used. These inductors and capacitors may be implemented in thin or thick film ceramic technology or embedded in organic or ceramic laminate.

Figure 4A:
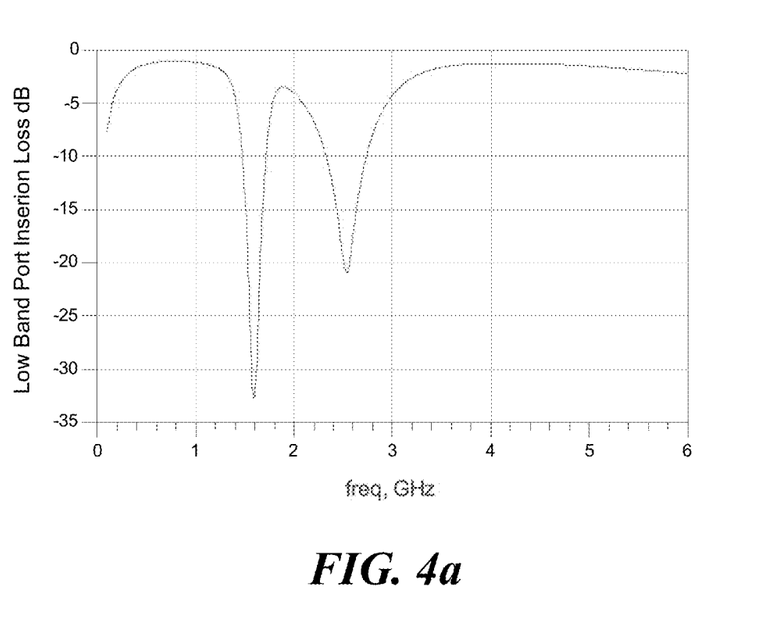
FIGS. 4a-b illustrate insertion loss performance graph of an embodiment antenna switch.
Figure 4B:
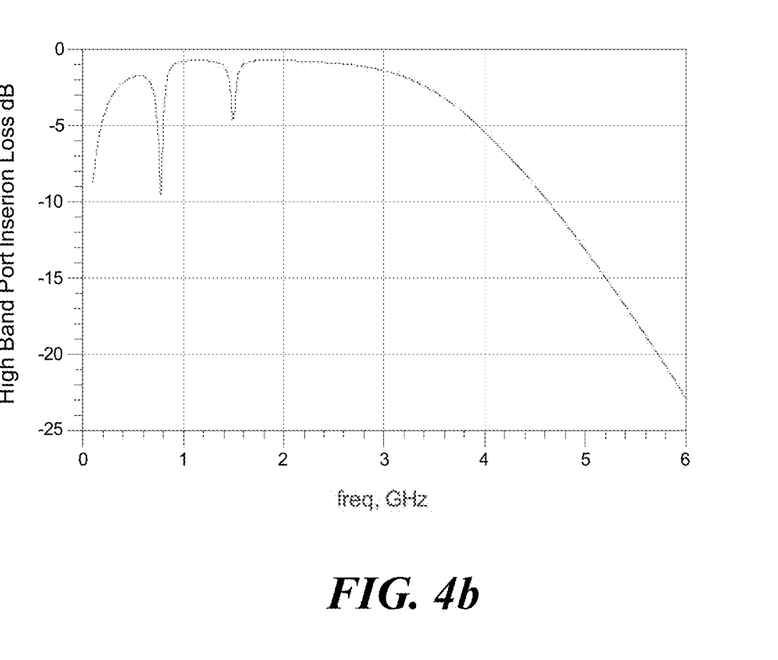

FIGS. 4a and 4b illustrate insertion loss performance of the embodiments antenna switch illustrated in FIG. 3. FIG. 4a illustrates the insertion loss performance of the low band signal path that includes SPnT switch 232. It can be seen that the second harmonic at 1572 MHz is attenuated by greater than 30 dB. FIG. 4b on the other hand illustrates an insertion loss plot of the high band switch that includes SPnT switch 230.

Figure 5:
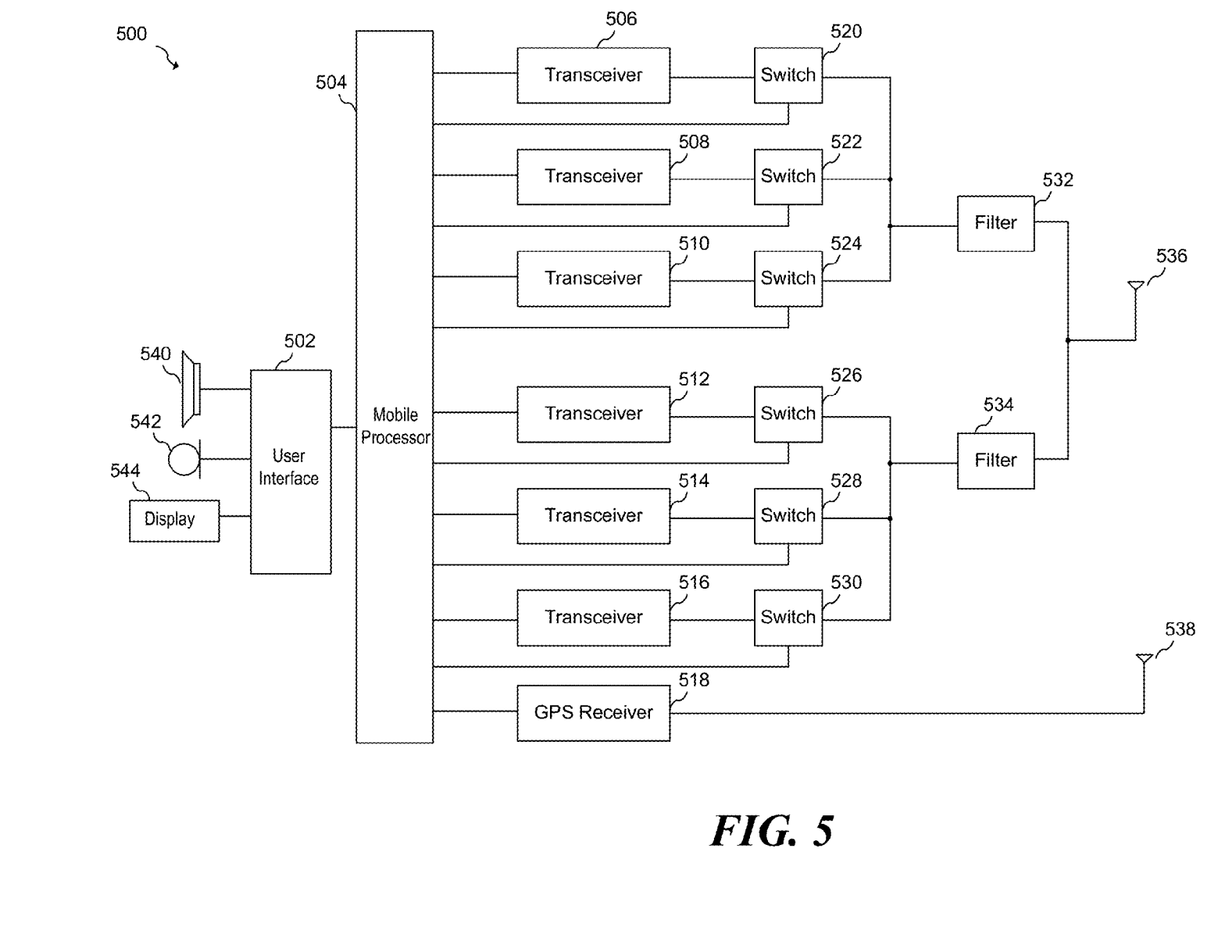
FIG. 5 illustrates a mobile communication device incorporating an embodiment antenna switch.

A block diagram of embodiment mobile device 500 is illustrated in FIG. 5. User device 500 may be, for example, a cellular telephone or other mobile communication device, such as a computer or network enabled peripheral. Alternatively, device 500 may be a non-mobile device, such as a desktop computer with wireless network connectivity. User device 500 has mobile processor 504, which is coupled to antenna 536 via transceivers, 506, 508, 510, 512, 514, 516 and 518. These transceivers are further coupled through switches 520, 522, 524, 526, 528 and 530, and through filters, 532 and 534, according to embodiments of the present invention described hereinabove. Transceivers 506, 508 and 510, for example, are used for high band signals greater then, for example, 1.5 GHz. Transceivers 512, 514, and 516, for example, are used for low band signals having a frequency of less than 1.0 GHz, for example. Filter 524 is configured to reject 1572 MHz, and filter 532 is configured to reject 786 MHz. GPS receiver 518 is also coupled to mobile processor, 504 as well as to GPS antenna 538. It should be understood that the particular configuration and frequency plan of mobile device 500 is just one example of many possible embodiments. Alternative embodiment mobile devices may have a different number of transceivers a different number of antennas and a different frequency plan.

In addition to the RF components, user interface 502 is coupled to mobile processor 504 and provides interfaces to loudspeaker 540, microphone 542 and display 544, for example. Alternatively, user device 500 may have a different configuration with respect to user interface 502, or user interface 502 may be omitted entirely.

Figure 6:
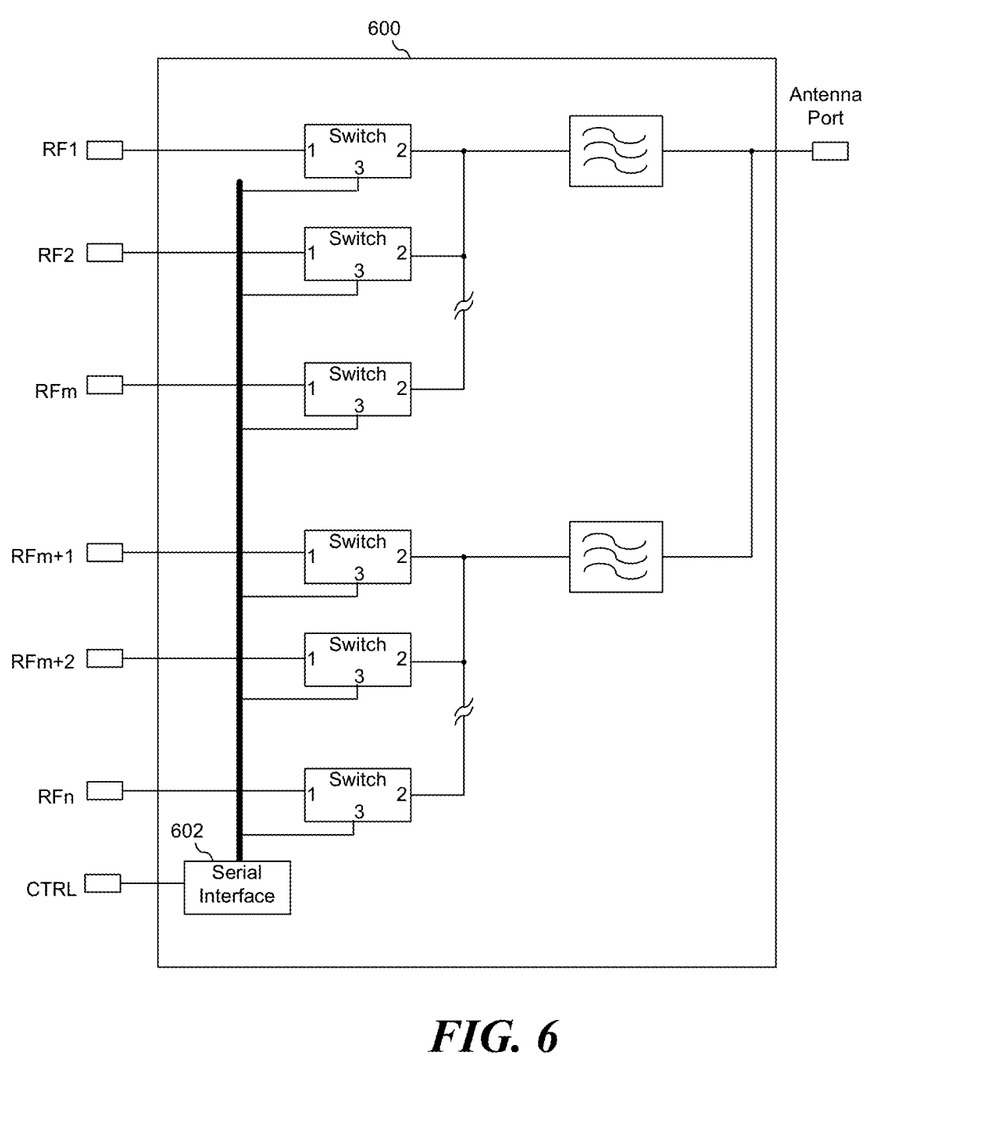
FIG. 6 illustrates an embodiment antenna switch module.

FIG. 6 illustrates antenna switching module 600 according to an embodiment of the present invention. Embodiment antenna module 600 has switches and filters which are configured according to embodiments described above. Additionally, module 600 may also have serial interface 602, which is used to control the state of individual switching elements. Serial interface 602 may operate according to a known standard serial interfaces such as a serial peripheral interface (SPI), or other interface standards as well as using nonstandard interfaces. Alternatively, serial interface 602 may be implemented with other types of digital interfaces. For example, a parallel interface.

In an embodiment, a filter network is configured to be coupled to a first switch, a second switch, and an output port. The filter network has a first filter coupled between the first switch and the output port, and a second filter coupled between the second switch and the output port. The first filter has a pass band having a first frequency range that includes a first frequency and the stop band that includes a second frequency. Furthermore, the second filter has a pass band having a second frequency range that includes the second frequency, and the stop band that includes the first frequency. In an embodiment, second frequency range is higher in frequency than the first frequency range, and the second frequency is a distortion product of the first frequency. In some embodiments, the distortion product is a second harmonic of the first frequency.

In an embodiment, the first filter is a low pass filter that has a pass band at the first frequency, and the second filter is a high pass filter that has a pass band at the second frequency. In some embodiments, the first filter comprises a notch filter having a notch at the second frequency, and the second filter comprises a notch filter having a notch at the first frequency. The first filter may include a first parallel LC circuit and the second filter may include a second parallel LC circuit.

In an embodiment, an antenna switch includes a first switching network, a second switching network, an output port configured to be coupled to antenna, a first filter coupled between the first switching network and the output port, and the second filter coupled between the second switching network and the output port. The first switching network is configured to operate at a first frequency range that includes a first frequency, and the second switching network is configured to operate at a second frequency range, where the second frequency range is higher in frequency than the first frequency range. The first filter has a pass band that includes the first frequency range and a stop band that includes a second frequency that is a harmonic of the first frequency. The second filter has a pass band that includes the second frequency range and a stop band that includes the first frequency. In some embodiments, the second frequency may be a second harmonic of the first frequency. For example, the first frequency may be about 786 MHz and the second frequency may be about 1572 MHz.

In some embodiments, the second filter attenuates an amplitude of the first frequency that is output by the first switching network such that nonlinearities within the second switching network generate less harmonics of the first frequency. In some embodiments, the first switching network includes a plurality of first switches and the second switching network includes a plurality of second switches. Each of the plurality of first switches and second switches may include MOS transistors. Alternatively, other transistor types may be used.

In some embodiments, the first filter is a low pass filter and the second filter is a high pass filter. In further embodiments, the first filter is a notch filter that has a notch at the second frequency and the second filter is a notch filter that has a notch at the first frequency. The first filter may be constructed using a first parallel LC circuit and the second filter may be constructed using a second parallel LC circuit. Alternatively, other tank types may be used instead of a LC circuit.

In some embodiments, the antenna switch may further include a matching network coupled between the second switching network and the second filter.

In an embodiment, a RF transmission system includes a first transmitter configured to operate within a first frequency range and a second transmitter configured to operate within a second frequency range. The first frequency range includes a first frequency and the second frequency range is higher in frequency than the first frequency range. The RF transmission system also includes an output port, a first switch coupled between the first transmitter and the output port, and the second switch coupled between the second transmitter and the output port, a first filter and a second filter. The first filter is coupled between the first switch and the output port, and has a pass band that includes the first frequency range, and the stop band that includes the second frequency. The second filter is coupled between the second switch and the output port, and has a pass band that includes the second frequency range and the stop band that includes the first frequency. In some embodiments, the second frequency is a harmonic of the first frequency. The RF transmission system may also include an antenna coupled to the output port.

In an embodiment, the first filter includes a first notch filter having a notch at the second frequency, and the second filter includes a second notch filter having a notch at the first frequency. In some embodiments, the first filter is implemented using a first parallel LC circuit and the second filter is implemented using a second parallel LC filter. The first filter may include a single tank parallel LC notch filter having a notch at the second frequency, and the second filter may include a second single tank parallel LC notch filter having a notch at the first frequency. In some embodiments, the second frequency is within a global positioning system (GPS) band.

In an embodiment, an antenna switch includes a first switching network configured to operate at a first frequency range, the second switching network configured to operate at a second frequency range, an output port configured to be coupled to an antenna, a first filter coupled between a first switching network and the output port, and the second filter coupled between the second switching network and the output port. An embodiment method of using this antenna switch includes coupling and RF transmitter to the output port via the first switching network. Coupling may include turning on a switch within the first switching network. The method also includes transmitting a signal at a first frequency with the RF transmitter, wherein the first frequency is within the first frequency range. A harmonic of the first frequency is attenuated using the first filter, the first frequency is passed through the first filter, and the first frequency is attenuated using the second filter. In some embodiments, attenuating a harmonic of the first frequency with the first filter includes attenuating the second harmonic of the first frequency.

An advantage of embodiments, in which both the high band and low band switches are coupled together at an antenna port using a simple filter, includes the ability to implement a simple switch topology that has good harmonic performance. A further advantage of such an embodiment includes the ability to provide less expensive circuit implementations that utilize less circuit board area. Further advantages of embodiment filters having a high stop-band impedance include a higher impedance seen at the conducting switch port, and improved in-band insertion loss.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A filter network configured to be coupled to a first switch, a second switch and an output port, the filter network comprising:
   a first parallel LC circuit directly connected between the first switch and the output port, the first parallel LC circuit having a pass band comprising a first frequency range that includes a first frequency, and a first stop band comprising a second frequency, the second frequency being a distortion product of the first frequency, wherein the first parallel LC circuit has a notch at the second frequency; and
   a second parallel LC circuit directly connected between the second switch and the output port, the second parallel LC circuit having a pass band comprising a second frequency range that includes the second frequency, and a second stop band comprising the first frequency, wherein the second frequency range is higher in frequency than the first frequency range, and the second parallel LC circuit has a notch at the first frequency.

2. A filter network configured to be coupled to a first switch, a second switch and an output port, the filter network comprising:
   a first filter coupled between the first switch and the output port, the first filter having a pass band comprising a first frequency range that includes a first frequency, and a first stop band comprising a second frequency, the second frequency being a distortion product of the first frequency, wherein the first filter is a first notch filter having a notch at the second frequency;
   a second filter coupled between the second switch and the output port, the second filter having a pass band comprising a second frequency range that includes the second frequency, and a second stop band comprising the first frequency, wherein the second frequency range is higher in frequency than the first frequency range, and the second filter is a second notch filter having a notch at the first frequency; and
   a third filter having a first terminal coupled to a node that connects the second switch to the second filter, and a second terminal coupled to a reference node, the third filter being a third notch filter having a notch frequency at the second frequency.

3. The filter network of claim 2 wherein the distortion product is a second harmonic of the first frequency.

4. The filter network of claim 2, wherein:
   the first filter is a first parallel LC circuit;
   the second filter is a second parallel LC circuit; and
   the third filter is a third series LC circuit.

5. The filter network of claim 2, wherein:
   the first filter is directly connected between the first switch and the output port;
   the second filter is directly connected between the second switch and the output port; and
   the first terminal of the third filter is directly connected to the node that connects the second switch to the second filter.

6. An antenna switch comprising:
   a first switching network configured to operate at a first frequency range, the first frequency range including a first frequency;
   a second switching network configured to operate at a second frequency range, the second frequency range being higher in frequency than the first frequency range;
   an output port configured to be coupled to an antenna;
   a first filter directly connected between the first switching network and the output port, the first filter having a pass band comprising the first frequency range, and a first stop band comprising a second frequency that is a harmonic of the first frequency, wherein first filter is a first notch filter having a notch at the second frequency;
   a second filter directly connected between the second switching network and the output port, the second filter having a pass band comprising the second frequency range and a second stop band comprising the first frequency, wherein the second filter is a second notch filter having a notch at the first frequency; and a third filter coupled to a node that connects the second switch to the second filter, the third filter being a third notch filter having a notch frequency at the second frequency.

7. The antenna switch of claim 6, wherein the second filter attenuates an amplitude of the first frequency that is output by the first switching network, such that nonlinearities within the second switching network generate less harmonics of the first frequency.

8. The antenna switch of claim 6, wherein:
the first switching network comprises a plurality of first switches; and
the second switching network comprises a plurality of second switches.

9. The antenna switch of claim 8, wherein each of the plurality of first switches and second switches comprise MOS transistors.

10. The antenna switch of claim 6, wherein:
the first notch filter is a first parallel LC circuit;
the second notch filter is a second parallel LC circuit; and
the third notch filter is a third series LC circuit.

11. The antenna switch of claim 6, wherein:
the first filter is directly connected between the first switching network and the output port;
the second filter is directly connected between the second switching network and the output port; and
third filter is directly connected to the node that connects the second switch to the second filter.

12. The antenna switch of claim 6, wherein:
the first filter is a first parallel LC circuit; and
the second filter is a second parallel LC circuit.

13. The antenna switch of claim 6, wherein the second frequency is a second harmonic of the first frequency.

14. The antenna switch of claim 6, wherein the first frequency is 786 MHz; and
the second frequency is 1572 MHz.

15. The antenna switch of claim 6, further comprising a matching network coupled between the second switching network and the second filter.

16. An RF transmission system comprising:
a first transmitter configured to operate within a first frequency range, the first frequency range including a first frequency;
a second transmitter configured to operate within a second frequency range, the second frequency range higher than the first frequency range;
an output port;
a first switch coupled between the first transmitter and the output port;
a second switch coupled between the second transmitter and the output port;
a first filter directly connected between the first switch and the output port, the first filter having a pass band comprising the first frequency range, and a first stop band comprising the second frequency, the second frequency being a harmonic of the first frequency, wherein the first filter is a first notch filter having a notch at the second frequency; and
a second filter directly connected between the second switch and the output port, the second filter having a pass band comprising the second frequency range and a second stop band comprising the first frequency, wherein the second filter is a second notch filter having a notch at the first frequency; and
a third filter coupled to a node that connects the second switch to the second filter, the third filter being a third notch filter having a notch frequency at the second frequency.

17. The RF transmission system of claim 16, further comprising an antenna coupled to the output port.

18. The RF transmission system of claim 16, wherein:
the first filter is directly connected between the first switch and the output port;
the second filter is directly connected between the second switch and the output port; and
the third filter is directly connected to the node that connects the second switch to the second filter.

19. The RF transmission system of claim 16, wherein:
the first filter is a first parallel LC circuit; and
the second filter is a second parallel LC circuit.

20. The RF transmission system of claim 16, wherein:
the first filter is a first single-tank parallel LC notch filter having a notch at the second frequency; and
the second filter is a second single-tank parallel LC notch filter having a notch at the first frequency.

21. The RF transmission system of claim 16, wherein the second frequency is within a Global Positioning System (GPS) band.

22. A method of operating an antenna switch comprising a first switching network configured to operate at a first frequency range, a second switching network configured to operate at a second frequency range, an output port configured to be coupled to an antenna, a first filter directly connected between a first switching network and the output port, and a second filter directly connected between the second switching network and the output port, the method comprising:
coupling a RF transmitter to the output port via the first switching network, coupling comprising turning-on a switch within the first switching network;
transmitting a signal at a first frequency with the RF transmitter, wherein the first frequency is within the first frequency range;
attenuating a harmonic of the first frequency with the first filter, wherein the first is a first notch filter with having a notch at the harmonic of the first frequency;
passing the first frequency though the first filter;
attenuating the first frequency with the second filter, wherein the second filter is a second notch filter having a notch at the first frequency; and
attenuating the harmonic of the first frequency with a third filter coupled between the second switching network and the second filter.

23. The method of claim 22, wherein the attenuating a harmonic of the first frequency with the first filter comprises attenuating a second harmonic of the first frequency.

24. The method of claim 22, wherein:
the first filter is directly connected between the first switching network and the output port; and
the second filter is directly connected between the second switching network and the output port.

* * * * *